United States Patent
Polomoff et al.

(10) Patent No.: US 11,740,418 B2
(45) Date of Patent: Aug. 29, 2023

(54) BARRIER STRUCTURE WITH PASSAGE FOR WAVEGUIDE IN PHOTONIC INTEGRATED CIRCUIT

(71) Applicant: GLOBALFOUNDRIES U.S. Inc., Santa Clara, CA (US)

(72) Inventors: Nicholas A. Polomoff, Hopewell Junction, NY (US); John J. Ellis-Monaghan, Grand Isle, VT (US); Frank G. Kuechenmeister, Dresden (DE); Jae Kyu Cho, Niskayuna, NY (US); Michal Rakowski, Ballston Spa, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 173 days.

(21) Appl. No.: 17/209,416

(22) Filed: Mar. 23, 2021

(65) Prior Publication Data
US 2022/0308297 A1    Sep. 29, 2022

(51) Int. Cl.
  *G02B 6/42*   (2006.01)
  *H01L 23/00*  (2006.01)
  *G02B 6/30*   (2006.01)
  *G02B 6/12*   (2006.01)

(52) U.S. Cl.
  CPC ............ *G02B 6/4248* (2013.01); *G02B 6/30* (2013.01); *H01L 23/562* (2013.01); *G02B 2006/12119* (2013.01)

(58) Field of Classification Search
  CPC .......................... G02B 6/4248; H01L 23/562
  See application file for complete search history.

(56) References Cited

U.S. PATENT DOCUMENTS

| | | | |
|---|---|---|---|
| 5,652,459 | A  | 7/1997  | Chen |
| 5,831,330 | A  | 11/1998 | Chang |
| 5,926,697 | A  | 7/1999  | Yaung et al. |
| 6,074,104 | A  | 6/2000  | Higashikawa |
| 6,870,265 | B2 | 3/2005  | Kurimoto et al. |
| 6,967,392 | B2 | 11/2005 | Tsai et al. |

(Continued)

FOREIGN PATENT DOCUMENTS

| | | |
|---|---|---|
| CN | 1617312 A   | 5/2005 |
| CN | 100349290 C | 11/2007 |

(Continued)

OTHER PUBLICATIONS

Taiwanese Examination Report for corresponding TW Application No. 107121701 dated Apr. 17, 2019, 17 pages.

*Primary Examiner* — Daniel Petkovsek
(74) *Attorney, Agent, or Firm* — Anthony Canale; Hoffman Warnick LLC

(57) ABSTRACT

Embodiments of the disclosure provide a photonic integrated circuit (PIC) structure with a passage for a waveguide through a barrier structure. The PIC structure includes a barrier structure on a substrate, having a first sidewall and a second sidewall opposite the first sidewall. A passage is within the barrier structure, and extends from a first end at the first sidewall of the barrier structure to a second end at the second sidewall of the barrier structure. A shape of the passage includes a reversal segment between the first end and the second end. A waveguide within the passage and extends from the first end to the second end of the barrier structure.

20 Claims, 11 Drawing Sheets

(56) References Cited

U.S. PATENT DOCUMENTS

| | | |
|---|---|---|
| 6,981,806 B2 | 1/2006 | Benzoni et al. |
| 7,009,222 B2 | 3/2006 | Yang |
| 7,265,438 B2 | 9/2007 | Tsai et al. |
| 7,466,284 B2 | 12/2008 | Barry |
| 7,602,065 B2 | 10/2009 | Hou et al. |
| 7,646,078 B2 | 1/2010 | Jeng et al. |
| 7,898,056 B1 | 3/2011 | Keramat et al. |
| 8,004,066 B2 | 8/2011 | Kim et al. |
| 8,188,574 B2 | 5/2012 | Angyal et al. |
| 8,242,586 B2 | 8/2012 | Chang et al. |
| 8,399,897 B2 | 3/2013 | Sherrer et al. |
| 8,674,508 B2 | 3/2014 | Wang et al. |
| 8,729,664 B2 | 5/2014 | Gambino et al. |
| 8,803,290 B2 | 8/2014 | Frederick, Jr. et al. |
| 8,818,146 B2 | 8/2014 | Vahala et al. |
| 8,847,297 B2 | 9/2014 | Kim et al. |
| 8,933,567 B2 | 1/2015 | Bang et al. |
| 9,627,332 B1 | 4/2017 | Liang et al. |
| 9,673,154 B2 | 6/2017 | Tsutsue et al. |
| 9,778,417 B2 | 10/2017 | Cherchi et al. |
| 10,074,618 B1 | 9/2018 | Chen et al. |
| 10,230,027 B2 | 3/2019 | Chen |
| 10,416,380 B1 | 9/2019 | Chen et al. |
| 10,436,982 B1 | 10/2019 | Bian et al. |
| 10,598,875 B2 | 3/2020 | Xie |
| 11,448,318 B2 * | 9/2022 | Yao ................... H01L 23/585 |
| 2003/0218254 A1 | 11/2003 | Kurimoto et al. |
| 2004/0084777 A1 | 5/2004 | Yamanoue et al. |
| 2004/0085704 A1 | 5/2004 | Castillejo |
| 2004/0150073 A1 | 8/2004 | Matumoto et al. |
| 2004/0217477 A1 | 11/2004 | Tsai et al. |
| 2005/0098893 A1 | 5/2005 | Tsutsue et al. |
| 2005/0239273 A1 | 10/2005 | Yang |
| 2006/0202831 A1 | 9/2006 | Horch |
| 2007/0158849 A1 | 7/2007 | Higashi et al. |
| 2007/0172971 A1 | 7/2007 | Boroson |
| 2008/0251923 A1 | 10/2008 | Wang et al. |
| 2009/0140391 A1 | 6/2009 | Hou et al. |
| 2009/0159119 A1 | 6/2009 | Basol |
| 2009/0294929 A1 | 12/2009 | Lee et al. |
| 2010/0059867 A1 | 3/2010 | Chang et al. |
| 2010/0244199 A1 | 9/2010 | Sakuma et al. |
| 2010/0308464 A1 | 12/2010 | Tsutsue et al. |
| 2011/0215447 A1 | 9/2011 | Furusawa et al. |
| 2011/0241182 A1 | 10/2011 | Herberholz et al. |
| 2011/0244199 A1 | 10/2011 | Brennan et al. |
| 2012/0223445 A1 | 9/2012 | Lehr |
| 2013/0048980 A1 | 2/2013 | Yang et al. |
| 2014/0264901 A1 | 9/2014 | Saito et al. |
| 2014/0367835 A1 | 12/2014 | Wei et al. |
| 2016/0172359 A1 * | 6/2016 | Yoon ..................... H01L 29/402 257/401 |
| 2017/0315296 A1 | 11/2017 | Dumais |
| 2018/0122754 A1 | 5/2018 | Tatour et al. |
| 2019/0067210 A1 * | 2/2019 | Polomoff .............. H01L 23/562 |
| 2019/0137709 A1 * | 5/2019 | Shi ....................... G02B 6/4277 |
| 2020/0404814 A1 * | 12/2020 | Hector, Jr. ........... H05K 9/0003 |
| 2022/0291464 A1 | 9/2022 | Polomoff et al. |

FOREIGN PATENT DOCUMENTS

| | | | |
|---|---|---|---|
| CN | 101286483 A | | 10/2008 |
| CN | 101447462 A | | 6/2009 |
| GB | 2580652 A | * | 7/2020 ............ G01J 3/0205 |

\* cited by examiner

BARRIER STRUCTURE WITH PASSAGE FOR WAVEGUIDE IN PHOTONIC INTEGRATED CIRCUIT

TECHNICAL FIELD

The subject matter disclosed herein relates to barrier structures for integrated circuits. More specifically, various aspects described herein relate to a barrier structure with a passage for a waveguide, to impede moisture ingress and crack propagation.

BACKGROUND

Semiconductor microchips and integrated circuits (ICs) containing analog, digital and radio frequency (RF) elements require some level of protection from cracking and crack propagation during the dicing process, as well as protection from moisture penetration. If the IC were to experience either one of these phenomena (i.e., cracking or moisture penetration), the product's performance will degrade and the IC will experience reliability issues. To combat this, various structures may be embedded into a product to impede moisture and/or a propagating crack from entering the inner core of the IC. Such structures are typically found around the periphery of the IC and surround the inner core of the IC, thus forming a continuous ring framing the IC.

Typically these barrier structures take the form of a continuous ring with completely connected walls and absolutely no holes, voids, breaks, gaps or perforations that a crack or moisture could utilize to bypass the blockade or barrier and enter the IC core. Such a continuous ring structure prevents moisture degradation and crack propagation. Where ICs interface with photonic elements, optical waveguides must pass through the barrier structure to connect an optical fiber to active circuitry. This approach necessarily creates breaks or other discontinuities into the normally continuous barrier structure. These breaks or continuities can make a product vulnerable to cracks and moisture ingress into the active circuitry.

BRIEF SUMMARY

Aspects of the disclosure provide a photonic integrated circuit (PIC) structure, including: a barrier structure on a substrate, the barrier structure having a first sidewall, and a second sidewall opposite the first sidewall; a passage within the barrier structure, the passage extending from a first end at the first sidewall of the barrier structure to a second end at the second sidewall of the barrier structure, wherein a shape of the passage includes a reversal segment between the first end and the second end; and a waveguide within the passage and extending from the first end to the second end thereof.

Further aspects of the disclosure provide a photonic integrated circuit (PIC) structure, including: a crack stop structure on a substrate, the crack stop structure having an interior sidewall, and an exterior sidewall facing toward a perimeter sidewall of the substrate; a passage within the crack stop structure, the passage extending from a first end at the exterior sidewall of the crack stop structure to a second end at the interior sidewall of the crack stop structure, wherein a shape of the passage includes a reversal segment between the first end and the second end; and a waveguide within the passage and extending from the first end to the second end thereof.

Still further aspects of the disclosure provide a photonic integrated circuit (PIC) structure, including: a set of grating couplers on a substrate; an oxidation and mechanical barrier on the substrate, the oxidation and mechanical barrier having a first sidewall facing toward the set of grating couplers, and a second sidewall opposite the first sidewall; a passage within the oxidation and mechanical barrier, the passage extending from a first end at the first sidewall of the oxidation and mechanical barrier to a second end at the second sidewall of the oxidation and mechanical barrier, wherein a shape of the passage includes a reversal segment between the first end and the second end; and a waveguide within the passage extending from the first end to the second end thereof, wherein the waveguide couples the set of grating couplers to circuitry on the substrate.

BRIEF DESCRIPTION BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Figure 1:
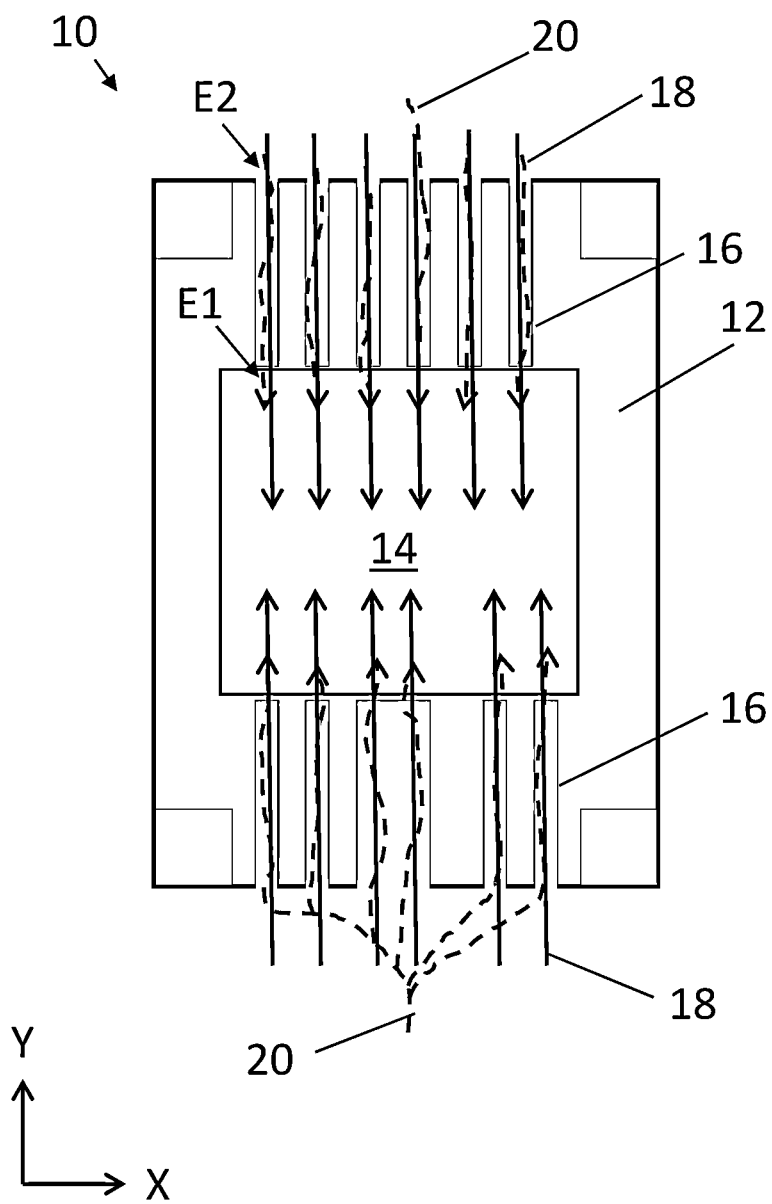
FIG. 1 shows an example of a conventional PIC structure with crack and moisture ingress paths.

FIG. 1 depicts a conventional structure in the form of a photonic integrated circuit (PIC) die 10. PIC die 10 may be formed on a substrate 12, including, e.g., one or more semiconductor materials. Substrate 12 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 12 or a portion thereof may be strained, and/or may have various amounts of doping to affect its conductivity in various regions.

A portion of substrate 12 may include active circuitry 14, where various electrically active components of PIC die 10 are located. Active circuitry 14 includes components for implementing multiple photonic functions and/or processing optical information signals received, and/or modified thereby via, e.g., one or more photonic elements. Such functions oftentimes include converting the optical information signals to electrical signals, or vice versa. Active circuitry 14 thus may include optical circuitry, electrical circuitry, and combinations of optical and electrical circuitry. In some cases, active circuitry 14 may be alternatively known as optical-electrical circuitry. As examples, active circuitry 14 of PIC die 10 may include one or more passive photonic devices such as waveguides, couplers, splitters, polarization splitters, rotators, filters, etc. According to further examples, active circuitry 14 of PIC die 10 may include one or more active photonic devices such as modulators, detectors, phase shifters, etc. Active circuitry 14 in some cases may include an optical waveguide system (e.g., grating coupler or I/O waveguide, some implementations of which are discussed elsewhere herein). Active circuitry 14 may also include, depending on application, other components such as, e.g., a Bragg reflector, an arrayed waveguide grating or other waveguide structure, transistor based electronics including detectors and modulators, amplifiers, and/or an externally modulated laser diode with an electro-absorption modulator. It is thus understood that active circuitry 14 may include and/or connect to various structures to guide light/signals from each optical fiber coupled thereto, individually. PIC die 10 also includes a plurality of V-groove fiber optic receptacles 16 formed within various portions of substrate 12.

As understood in the art, each V-groove fiber optic receptacle 16 may hold a portion of a photonic element (e.g., an optical fiber) therein for alignment with an input (e.g., an electrical and/or optical signal) to active circuitry 14. While groups of five or six V-groove fiber optic receptacles 16 are shown in FIG. 1, it is understood that any number of receptacles may be employed to receive any number of matching photonic elements. The presence of V-groove fiber optic receptacles 16 enables the delivery of inputs to active circuitry 14, but also may introduce certain inherent structural weaknesses into PIC die 10. For instance, any barrier structures for blocking the propagation of cracks, moisture ingress, etc., must have discontinuities to accommodate the pathway of V-groove fiber optic receptacles 16 and/or waveguides for coupling fiber(s) within receptacle(s) 16 to active circuitry 14. In conventional IC structures, such barrier structures would form a continuous ring about active circuitry 14. The barrier structure may extend from a first end E1 to a second end E2 at respective portions of substrate 12. Any breaks or discontinuities in a barrier structure may create a group of crack propagation pathways 18 (shown with solid lines) and/or a group of moisture propagation pathways 20 (shown with dashed lines) where cracks and/or external moisture may cross into active circuitry 14 from second end E2 to first end E1. In some cases, moisture and/or cracks reaching active circuitry 14 may cause a failure of PIC die 10 to operate as intended.

Figure 2:
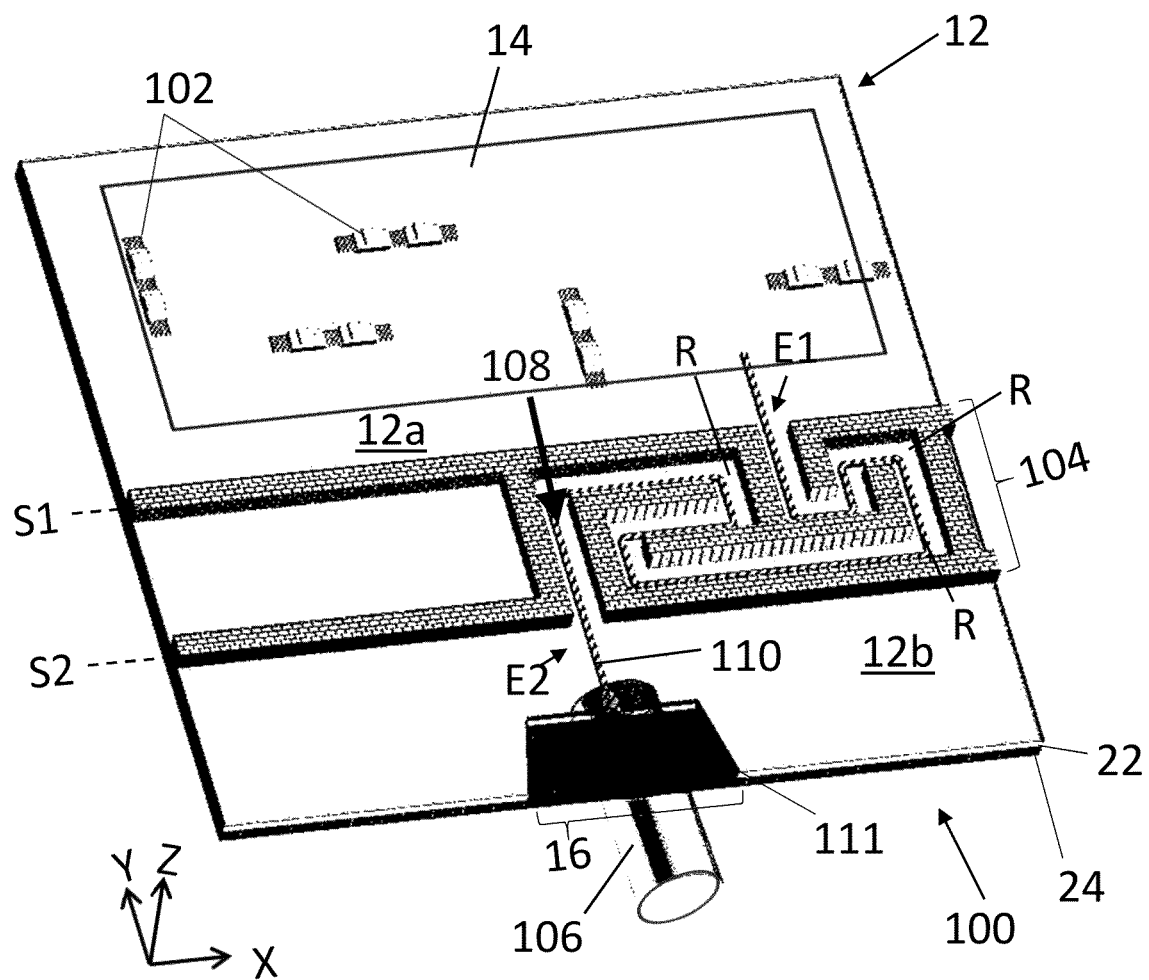
FIG. 2 shows a perspective view of a PIC structure with a barrier structure and passage for a waveguide, according to embodiments of the disclosure.

FIG. 2 depicts an expanded plan view of a portion of a PIC structure 100 according to embodiments of the disclosure. In the FIG. 2 example, substrate 12 may be a portion of a semiconductor on insulator (SOI) substrate, in which substrate 12 is positioned over a buried insulator layer 22 and a semiconductor base layer 24. Buried insulator layer 22 may include one or more oxide insulators and/or other insulating materials, while semiconductor base layer 24 may be formed of the same material as substrate 12 and/or a similar semiconductor material. In further implementations, substrate 12 may be a thin layer of semiconductor material.

PIC structure 100 differs from conventional PIC die 10 (FIG. 1) by including structural features to block or impede the process of moisture and/or cracks before they can reach active circuitry 14. Additional electrical devices 102 (e.g., capacitors, resistors, inductors, etc.) also may be located on substrate 12, within or near active circuitry 14. In the expanded view of PIC structure 100, a barrier structure 104 may be on substrate 12 horizontally between active circuitry 14 and an optical fiber 106. Barrier structure 104 may be any material or group of materials (e.g., metals, dielectric materials, etc.) on substrate 12 effective for blocking the flow of moisture and/or propagation of cracks.

Barrier structure 104 may subdivide substrate 12 into a first portion 12a near active circuitry 14, and a second portion 12b outside barrier structure 104. Portions 12a, 12b, may be structurally indistinct apart from their position relative to barrier structure 104. A first sidewall S1 of barrier structure 104 may face toward first portion 12a, while a second sidewall S2 of barrier structure 104 may face toward second portion 12b. Barrier structure 104 may have a composition that is selected to prevent mechanical deformities and/or foreign materials from passing therethrough. For example, barrier structure 104 may take the form of an oxidation and mechanical barrier, crack stop region, and/or other class of material for blocking the growth and/or propagation of cracks across regions where barrier structure 104 is formed. As will be discussed elsewhere herein, barrier structure 104 may include an oxidation and mechanical barrier 113 (FIG. 3 et seq.) and/or a metal crack stop 116 (FIG. 3 et seq.) in various configurations.

Regardless of its composition, barrier structure 104 includes space to allow various inputs (e.g., electrical and/or optical signals) to pass from optical fiber 106 of second portion 12b into active circuitry 14 of first portion 12a. Barrier structure 104 may include a passage 108, shaped to extend between a first end E1 of barrier structure 104 (e.g., through first sidewall S1 of barrier structure 104) to a second end E2 of barrier structure 104 (e.g., through second sidewall S2 of barrier structure 104). Passage 108 may be formed, e.g., by selective deposition and/or subsequent removing of oxidation and mechanical barrier and/or crack stop material on substrate 12 to create a pathway across substrate 12 where portions of barrier structure 104 are not present. First end E1 of passage 108 may be oriented toward active circuitry 14 of first portion 12a, while second end E2 of passage 108 may be oriented toward second portion 12b (i.e., portions of substrate 12 horizontally outside barrier structure 104). Passage 108 may have a lateral width sufficient for a waveguide 110 to pass therethrough. Waveguide 110 may have a diameter of, e.g., eight micrometers ($\mu$m), and/or may be of various other sizes so long as adjacent metal structures are sufficiently displaced to avoid optical interference with waveguide 110. Waveguide 110 may be coupled to optical fiber 106 through an optical fiber-waveguide optical coupler 111, i.e., any conceivable optical coupling and/or conversion medium for optical coupling of fibers to waveguide 110 material. Waveguide 110 may be formed, e.g. of silicon and/or other light transmitting media, and may extend horizontally through barrier structure 104 via several segments with varying orientations. Waveguide 110 may couple active circuitry 14 to optical fiber 106 (which may be within, e.g., V-groove fiber optic receptacle 16). Optical fiber 106 may be one of several optical fibers 106 (provided, e.g., as an array), each of which may be coupled within V-groove fiber optic receptacle 16 to one or more waveguides 110 of PIC structure 100. Such configurations are described elsewhere herein relative to various further implementations of PIC structure 100.

Passage 108 in barrier structure 104 may create space for cracks and/or moisture to propagate from second portion 12b of substrate 12 to first portion 12a. Passage 108 includes a reversal segment R (several shown) between first end E1 and second end E2 thereof. Reversal segment(s) R blocks or prevents the progress of moisture or cracks through PIC structure 100. The term "reversal segment," as used herein, encompasses any conceivable section of passage 108 that transitions from an initial "forward" direction between sidewalls S1, S2 to a "backward" direction between sidewalls S1, S2 opposite the forward direction, when tracing a pathway from first end E1 to second end E2, or vice versa. As examples, one or more reversal segments R may take the form of, e.g., U-turns, semicircular or ovular rounded bends, consecutive corners, teeth, zig zags, substantially triangular turns, and/or other geometries suitable for transitioning the orientation of passage 108 from facing toward first sidewall S1 to facing toward second sidewall S2, or vice versa. It is therefore understood that several reversal segments R within passage 108 may have distinct shapes. Passage 108 may include reversal segments R (four reversal segments R shown in the FIG. 2 example); such that each end E1, E2 of passage 108 is in a different sidewall (i.e., first sidewall S1 or second sidewall S2) of barrier structure 104. To further impede cracks and/or moisture, passage 108 in barrier structure 104 may have a length that is significantly greater than the distance between sidewalls S1, S2, e.g., at least approximately one-hundred and fifty $\mu$m. In some cases, passage 108 may extend over a length of over three-hundred $\mu$m, several millimeters (mm), or other lengths. In contrast to conventional PIC die structures, barrier structure 104 according to the disclosure includes passages 108 featuring discontinuous and interlocking walls that have patterns interweaved with one another without intersecting. Passages 108 thus define non-linear paths from optical fiber 106 to active circuitry 14; however, passages 108 according to embodiments of the disclosure prevent crack propagation and moisture ingress.

The presence of reversal segments R within passage 108 allows waveguide 110 to pass completely through barrier structure 104 from optical fiber(s) 106 to active circuitry 14, while providing additional technical benefits. Reversal segments R of passage 108 create a non-linear path, connecting waveguide 110 from optical fiber 106 to active circuitry 14. The presence of reversal segments R causes at least a portion of passage 108 to extend backwards from first sidewall S1 toward S2, relative to the initial orientation of passage 108 where the pathway of waveguide 110 begins. This shape prevents any cracks from reaching active circuitry 14 through passage 108 because a crack cannot propagate backwards toward its energy source. A crack has an external energy source (e.g., dicing of substrate 12 from a larger structure at its perimeter sidewall) from which the crack derives its propagation. The energy source defines a propagation direction. Reversal segments R of passage 108 are shaped such that the path must traverse forward and backwards directions through barrier structure 104. Since the energy source that creates a crack defines the crack's propagation direction, it is not possible for the crack to propagate in all possible directions (e.g., backwards). Although progression of moisture through passage 108 is not so limited in terms of its possible directions of travel, each reversal segment R impedes or otherwise blocks moisture from progressing toward active circuitry 14, e.g., due to the inability for water to be dislodged from reversal segment(s) R without being perturbed by other sources of energy. It is understood that moisture is less likely to reach active circuitry 14 from outside substrate 12 as the number of reversal segments R within each passage 108 increases.

Figure 3:
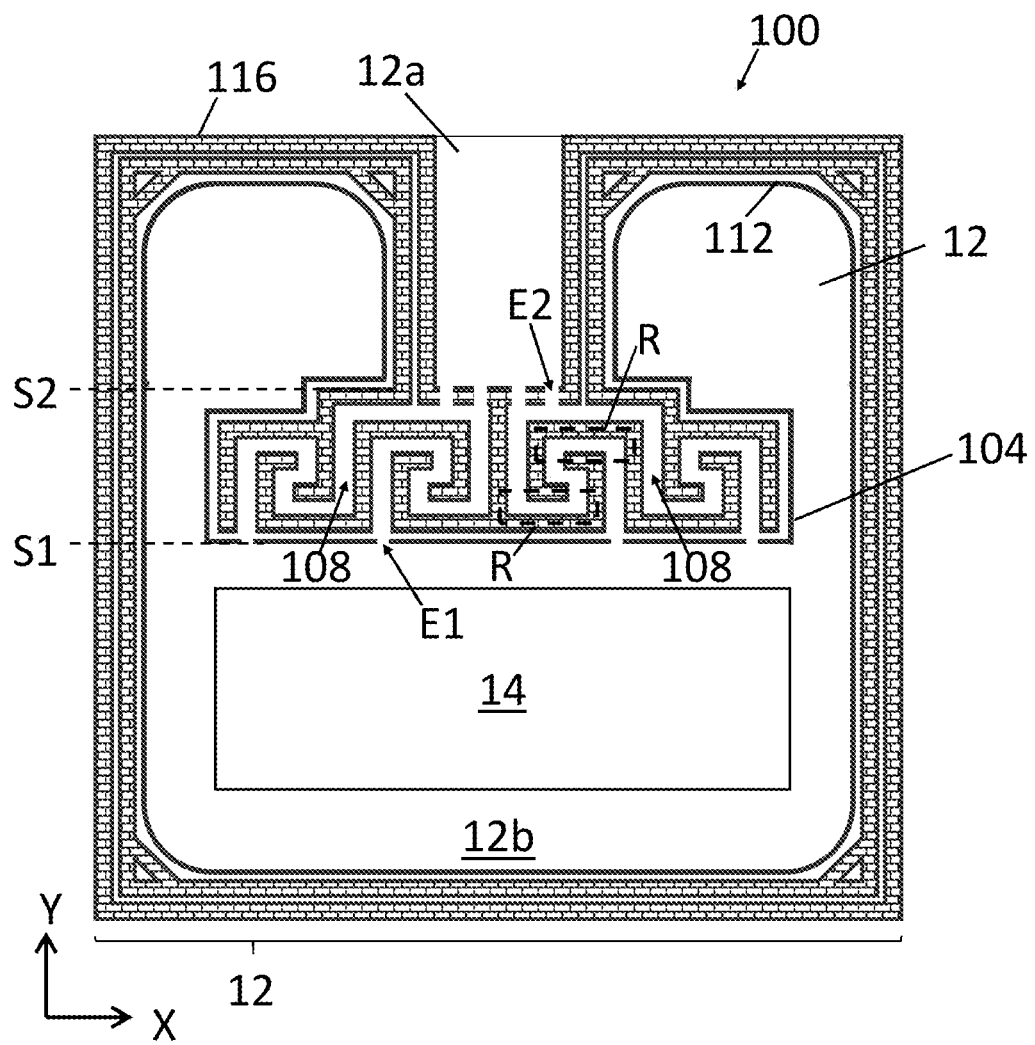
FIG. 3 shows a plan view of a PIC structure with a passage through a crack stop structure, with waveguide omitted, according to embodiments of the disclosure.

FIG. 3 depicts a plan view of PIC structure 100 in an example where multiple passageways 108 lead to active circuitry 14 through barrier structure 104. Waveguide(s) 110 are omitted from FIG. 3 solely for clarity of illustration. In this example, barrier structure 104 may include metal crack stop 116 positioned along and/or partially defining an outer perimeter of substrate 12. First portion 12a may be bounded by portions of barrier structure 104. Each passage 108 may extend through barrier structure 104 toward active circuitry 14. A guard ring 112 (formed, e.g., of metal or similar materials) may be alongside an interior sidewall (e.g., second sidewall S2) of barrier structure 104 to impede moisture and/or various other contaminants from reaching active circuitry 14 of PIC structure 100.

Figure 4:
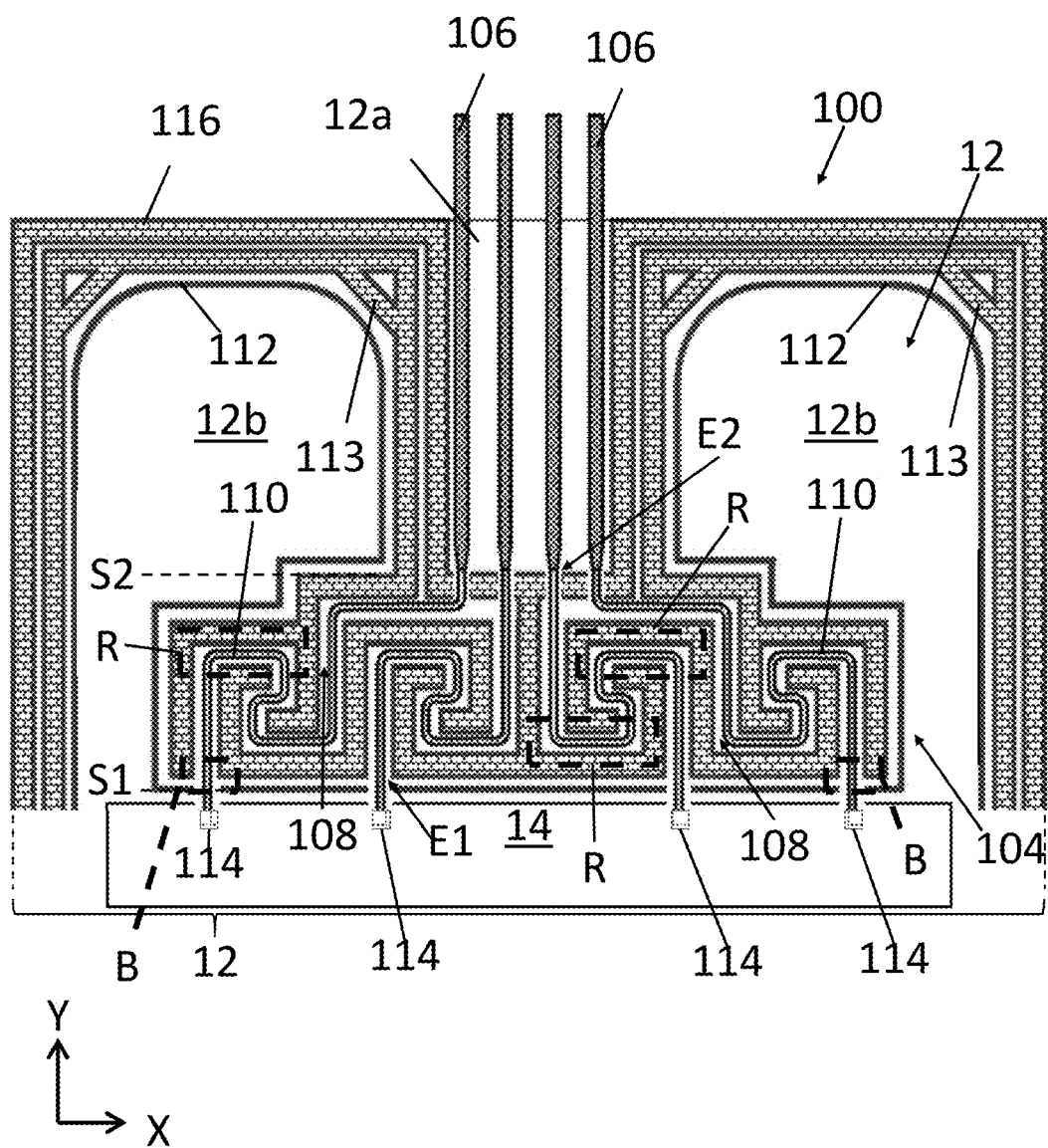
FIG. 4 shows a partial plan view of a PIC structure with a crack stop structure, guard ring, and oxidation and mechanical barrier, according to embodiments of the disclosure.

Referring to FIGS. 3 and 4 together, each passage 108 includes reversal segments R for preventing crack propagation and/or moisture ingress through barrier structure 104, accommodating the use of multiple optical fibers 106 and waveguides 110, and without fundamentally changing the design of PIC structure 100. Embodiments of the disclosure thus may provide any number of passages 108 suitable to accommodate a corresponding number of optical fibers 106 and/or waveguides 110. These and other features of PIC structure 100 may be modified and/or used in various further implementations described herein. Although such examples are in some cases described separately for emphasis and/or ease of explanation, it is understood that further modifications and/or example features described herein may be implemented in combination with any other example of PIC structure 100 discussed herein. One or more optical receivers 114 (FIG. 4 only) may couple waveguides 110 to active circuitry 14. Optical receiver(s) 114 may be any currently known or later developed component for converting optical signals into electrical signals to be processed within active circuitry 14.

FIG. 4 depicts an implementation in which metal crack stop 116 is horizontally adjacent guard ring 112, with passage 108 (including reversal segments R) being within metal crack stop 116. Metal crack stop 116 in this case can continue to perform its function of blocking crack propagation toward active circuitry 14, despite the presence of passage 108 therein. In this example, crack propagation lines cannot travel beyond reversal segments R due to the nature of crack propagation energy described herein. In this configuration, portions of barrier structure 104 are between first end E1 of passage 108 and active circuitry 14. To prevent physical contact and/or reduce or eliminate reflective interference waveguide 110 and nearby elements of barrier structure 104, waveguide 110 and/or oxidation and guard ring 112 may include one or more conductive bridge segments B. Each bridge segment B is formed such that waveguide 110 passes under guard ring 112, allowing passage of waveguide 110 to active circuitry 14 maintaining structural continuity of guard ring 112. Each bridge segment B may physically connect two portions of guard ring 112 to maintain continuity of waveguide(s) 110 thereunder. Each bridge segment B may pass horizontally over the top of guard ring 112 and/or other portions of substrate 12, at a height that reduces or prevents reflective interference between light within waveguide 110 and barrier structure 104 and/or other structures. Bridge segments B thus allow some portions of barrier structure 104 (e.g., guard ring 112) to be structurally continuous while allowing waveguide 110 to pass to active circuitry 14.

Figure 5:
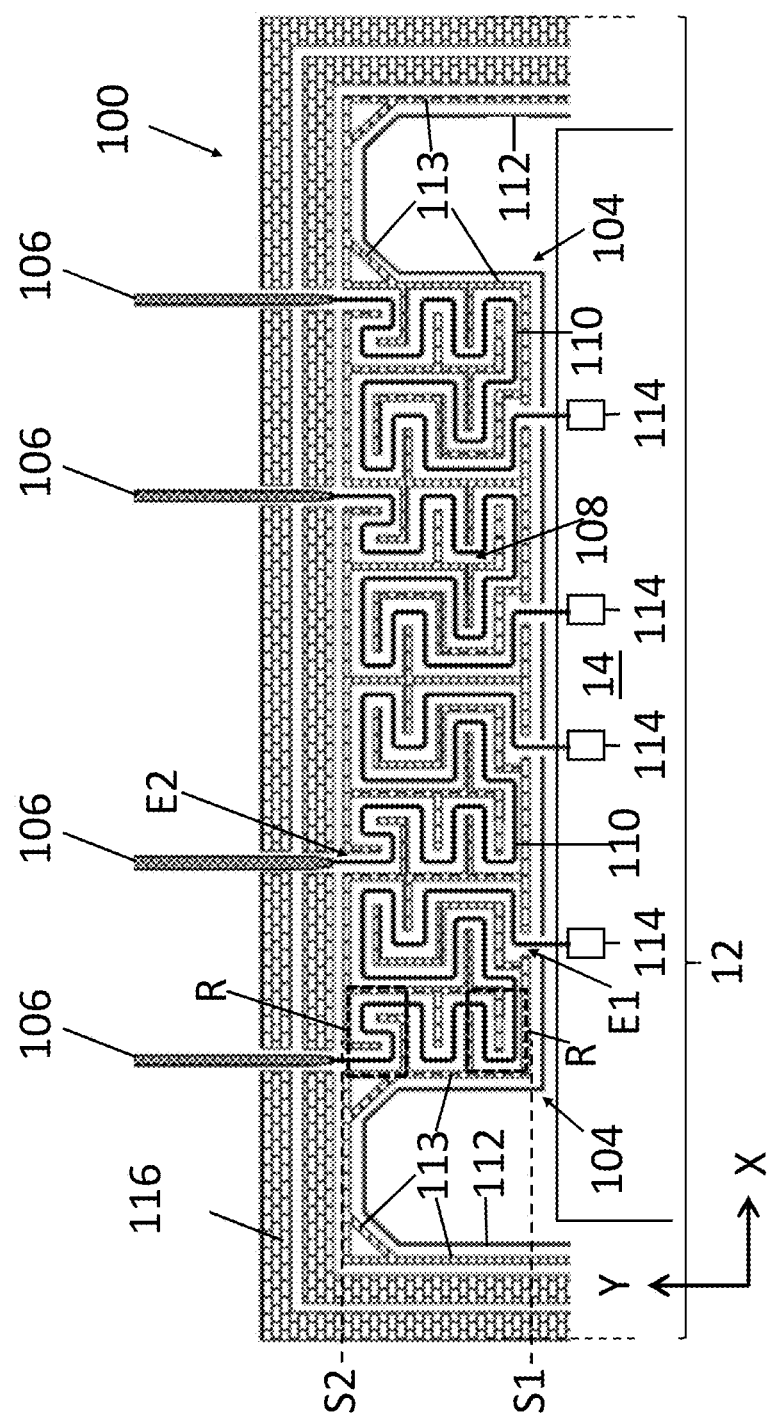
FIG. 5 shows an expanded partial plan view of a PIC structure with a passage through a crack stop structure, with a waveguide included, according to embodiments of the disclosure.

Referring now to FIG. 5, embodiments of PIC structure 100 may include an oxidation and mechanical barrier 113, e.g., one or more nitride film materials such as silicon nitride (SiN), and/or similar materials operable to block moisture flow through substrate 12. Portions of barrier structure 104 may include an oxidation and mechanical barrier material, sometimes known as a little moisture oxidation barrier ("LMOB") material, for blocking the flow of moisture from second portion 12b into first portion 12a. Nitride films and other oxidation barrier materials may be used together with crack stop materials, noise suppression regions, and/or other types of materials. Additional features that can be incorporated into barrier structure 104 also may include, for example, ground contacts (not shown) attached to walls of passage 108 for noise propagation prevention, dehydration liners (not shown) on walls of passage 108 for moisture ingress prevention, and/or supplemental metal lines or air gaps (not shown) formed at ends of passage barrier structure 104. These and other elements may be included substantially in accordance with conventional PIC structures to further strengthen noise propagation and/or mitigate moisture ingress.

Various portions of passage 108 may be located within oxidation and mechanical barrier 113 in further implementations of PIC structure 100. As shown, metal crack stop 116 of barrier structure 104 may be located at the outer perimeter sidewall of substrate 12, with portions of optical fiber(s) 106 extending linearly through metal crack stop 116 to oxidation and mechanical barrier 113. Metal crack stop 116 may be formed of copper, and/or any other metallic structure configured to prevent crack propagation through substrate 12, and/or adjacent dielectric layers. In this case, oxidation and mechanical barrier 113 of barrier structure 104 is shown to have opposite sidewalls S1, S2, rather than metal crack stop 116. Oxidation and mechanical barrier 113 may include passage 108 and waveguide 110, in contrast to other embodiments where passage 108 (including reversal segments R) and waveguide 110 are within metal crack stop 116. Passage 108 within oxidation and mechanical barrier 113 may include reversal segment(s) R between first sidewall S1 and second sidewall S2 as passage 108 traverses a pathway from first end E1 to second end E2. Although passage 108 may be formed within oxidation and mechanical barrier 113 instead of metal crack stop 116, passage 108 may have substantially similar dimensions to other implementations described herein, e.g., a length of at least approximately one-hundred and fifty μm and a width of approximately eight μm, and/or any conceivable value appropriate for a particular size and/or technical setting.

Figure 6:
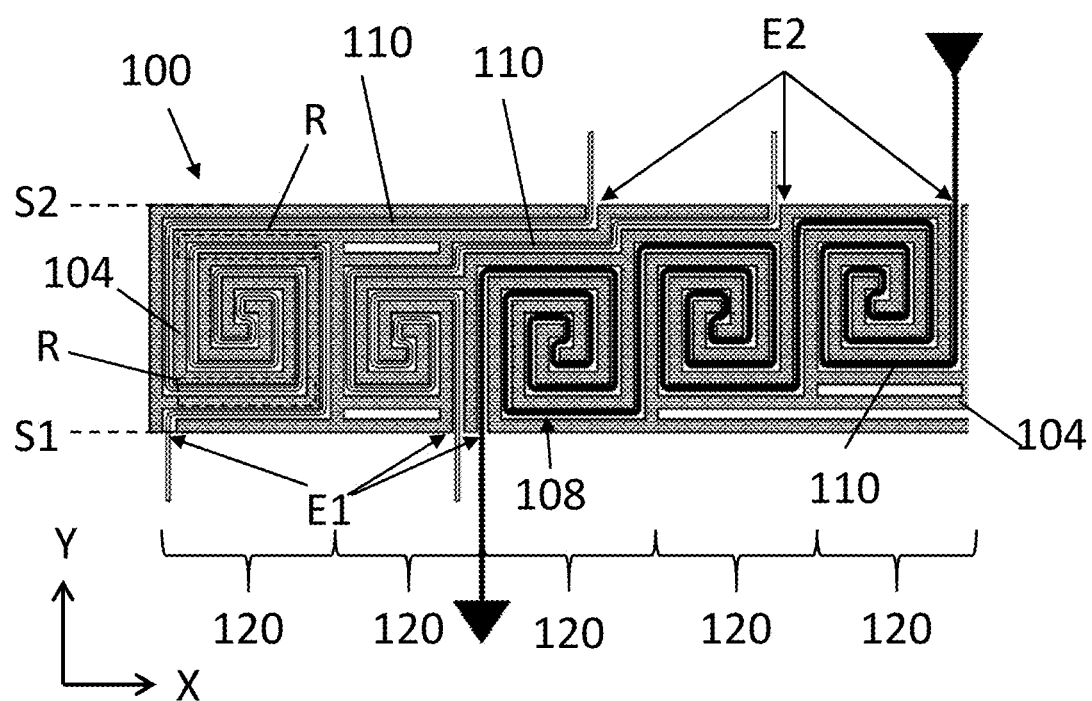
FIG. 6 shows an expanded plan view of a PIC structure with a passage through a crack stop structure, annotated with moisture ingress paths, according to embodiments of the disclosure.

FIG. 6 provides a partial view of barrier structure 104 for PIC structure 100, depicting possible routes where moisture could attempt to flow from second end E2 to first end E1 through passage 108. One such pathway for moisture ingress are indicated with a solid line in FIG. 6. Barrier structure 104 may represent either a portion of oxidation and mechanical barrier 113 and/or metal crack stop 116. Each passage 108 within barrier structure 104 may have several swirl-type segments 120 horizontally adjacent to each other, forming a pathway length that is several times greater (e.g., approximately twenty-times greater or more) than the distance between sidewalls S1, S2 of barrier structure 104. The presence of reversal segments in each swirl-type segment 120 will substantially impede the ability for moisture to travel between ends E1, E2 of passage 108. Increasing the length of each passage 108, e.g., by changing the number, size, and/or shape of such swirl-type segments 120 in barrier structure 104. In some implementations, swirl-type segments 120 of one passage 108 may circumnavigate an entire perimeter of substrate 12 and thus further impede the entry of moisture toward active circuitry 14 (FIGS. 1-5). As noted above, these moisture paths through passage 108 of barrier structure 104 are so long that moisture ingress to active circuitry 14 is nearly impossible, if not entirely impossible.

Figure 7:
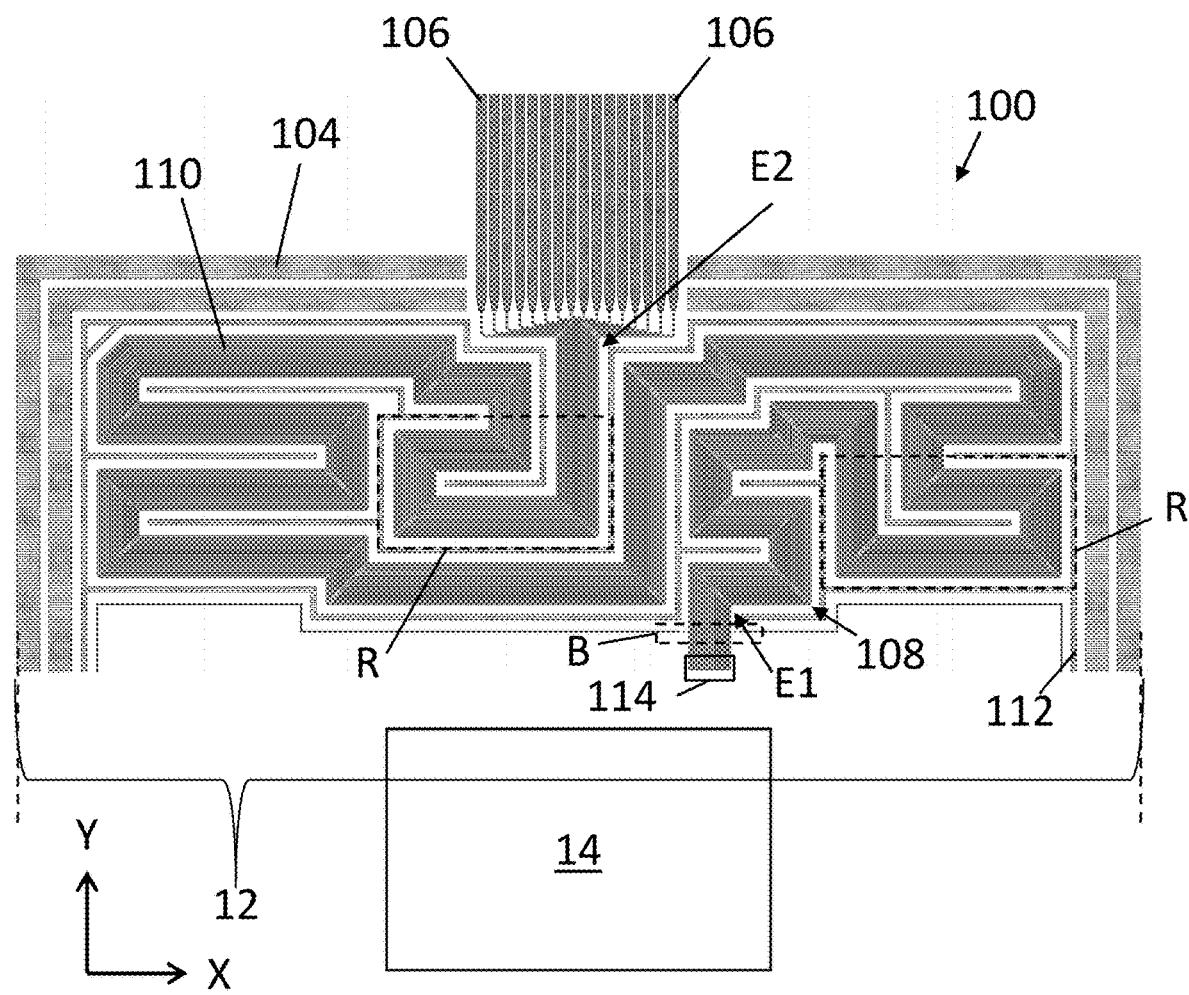
FIG. 7 shows a partial plan view of a PIC structure with a single passage in a barrier structure for multiple waveguides, according to embodiments of the disclosure.

FIG. 7 depicts a partial plan view of PIC structure 100, in which one passage 108 couples an array of optical fibers 106 to active circuitry 14. The array of optical fibers 106 may be optically coupled to several waveguides 110, which themselves may be provided in an array. As shown, waveguides 110 may optically interface with several individual fiber ends in the array of optical fibers 106 at second end E2 of passage 108. Passage 108 may be the sole pathway for waveguides 110 from optical fibers 106 to active circuitry 14. When passage 108 accommodates multiple waveguides 110, passage 108 may be sized and shaped for transmitting optical signals from multiple optical fibers 106 to active circuitry 14. For example, passage 108 may have a width of at fifty μm to accommodate ten or more waveguides 110. By including only one passage 108 in barrier structure 104, passage 108 may include more reversal segments R, and/or may have a greater length, than may be feasible in other implementations.

Figure 8:
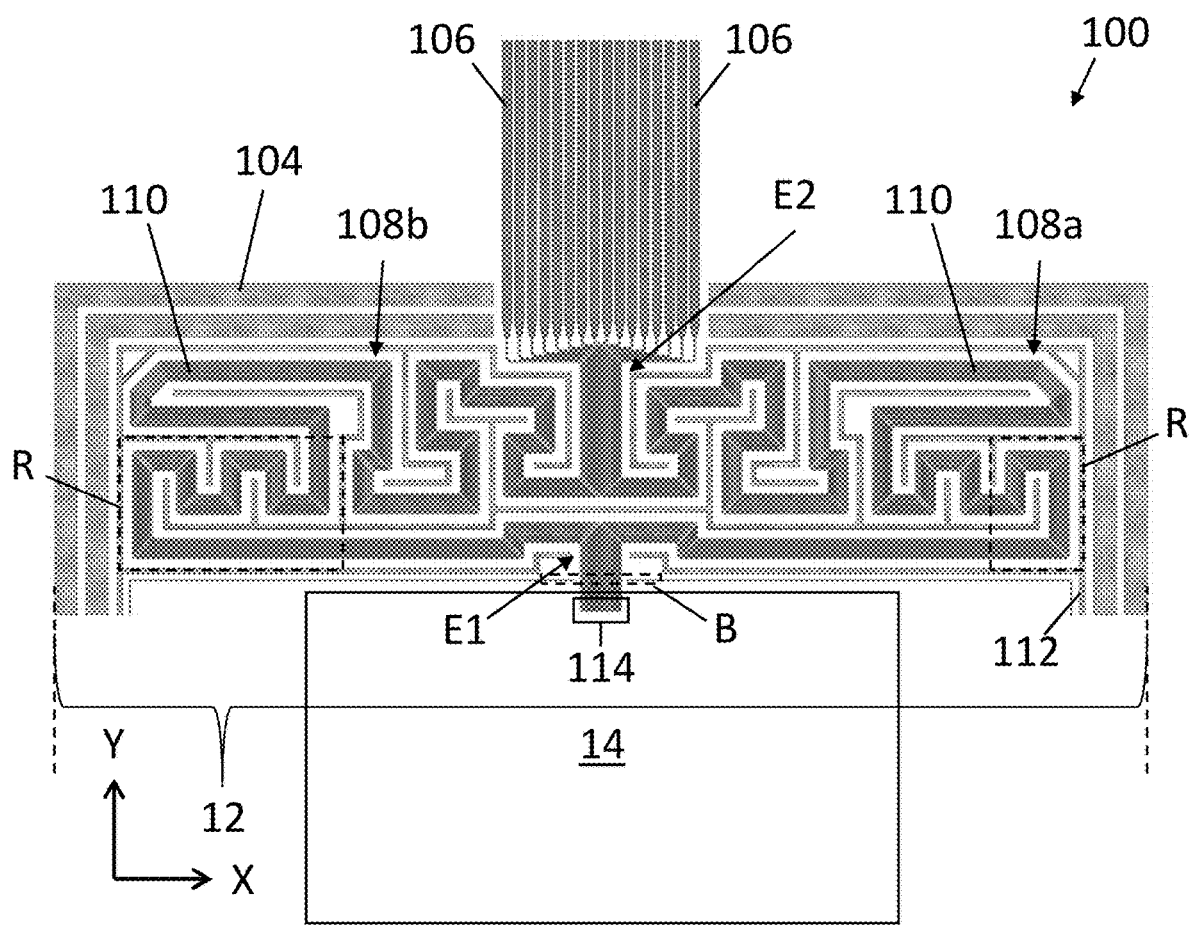
FIG. 8 shows a partial plan view of a PIC structure with a branching passage in a barrier structure for multiple waveguides, according to embodiments of the disclosure.

Turning to FIG. 8, embodiments of PIC structure 100 may include multiple pathways for coupling one group of optical fibers 106 to active circuitry 14. For instance, one passage 108 may include a first branch segment 108a and a second branch segment 108b, representing two alternate portions of passage 108 through which waveguide 110 may pass. In this case, one or more waveguides 110 may traverse barrier structure 104 through a first branch segment 108a of passage 108 while other waveguides 110 may traverse barrier structure 104 through a second branch segment 108b of passage 108. First and second branch segments 108a, 108b may be defined optionally may split from a single portion of passage 108 and/or rejoin each other between first end E1 and second end E2. Passage 108 thus may couple all waveguides 110 to active circuitry 14 through one first end E1, and/or may couple all waveguides 110 to optical fiber 106 through one second end E2. In further implementations, one or more branch segments 108a, 108b may couple waveguides 110 to active circuitry 14 and/or optical fiber(s) 106 through multiple first ends E1 and/or second ends E2.

Figure 9:
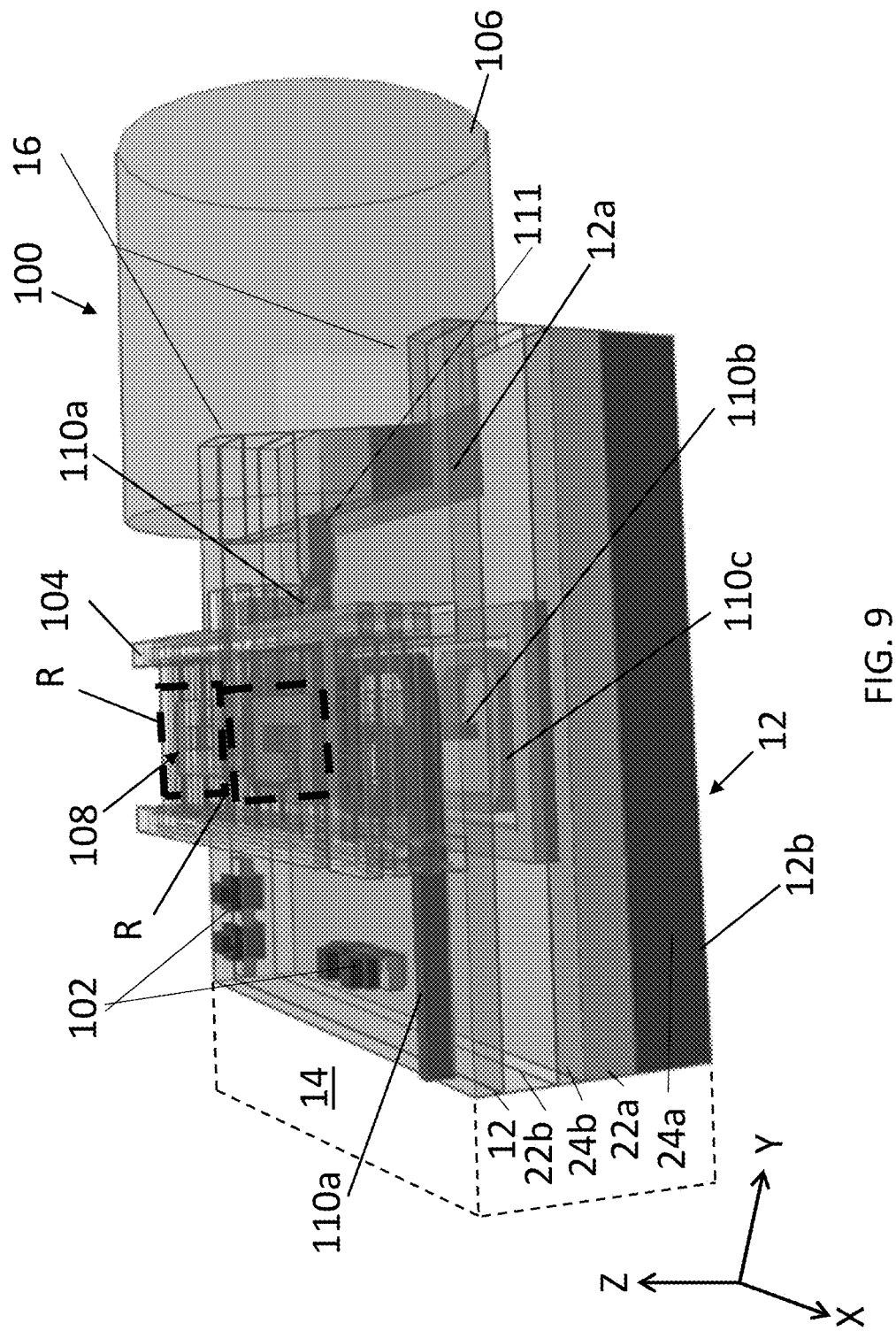
FIG. 9 shows a perspective view of a barrier structure with a three-dimensional pathway for a waveguide, according to embodiments of the disclosure.

As shown in FIG. 9, passage 108 may traverse a three-dimensional pathway in some implementations of PIC structure 100. That is, various portions of passage 108 in barrier structure 104 may extend in various directions within a horizontal plane, and/or in directions that are vertically perpendicular to the horizontal plane of other portions of passage 108. Similar to other implementations, optical fiber 106 may couple to waveguide 110 on a surface of substrate 12, and may couple waveguide 110 to active circuitry 14 on the same surface of substrate 12. In some cases, substrate 12 may include and/or may be positioned over multiple buried insulator layers 22a, 22b and/or SOI substrates (e.g., semiconductor layers 24a, 24b). In this case, optical fiber 106 may be substantially coplanar with its connection to optical fiber 106. Within passage 108, however, waveguide 110 may traverse horizontal and vertical pathways in three dimensions, and may include reversal segment(s) R as discussed with respect to other implementations discussed herein.

Figure 10:
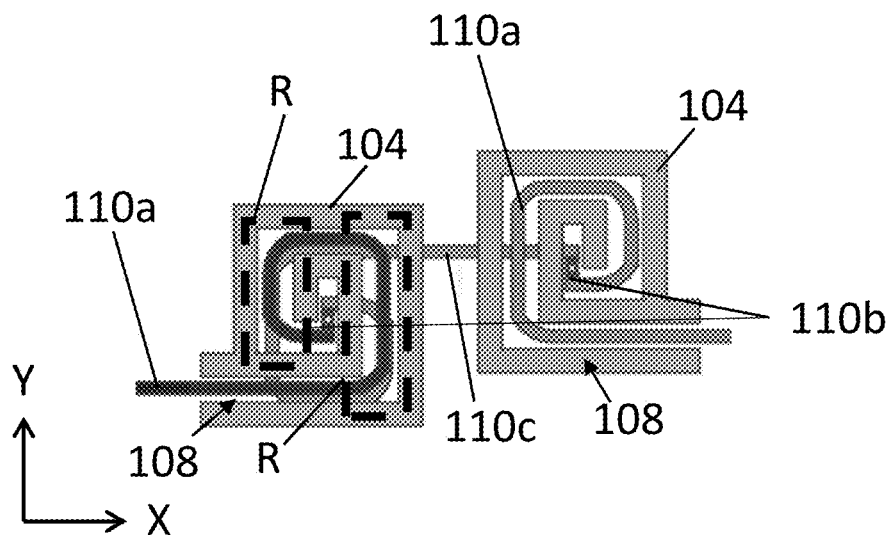
FIG. 10 shows a plan view in plane X-Y of a three-dimensional pathway shape, according to embodiments of the disclosure.
Figure 11:
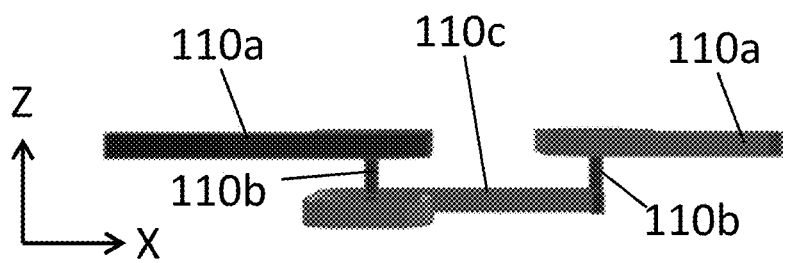
FIG. 11 shows a side view in plane X-Z of a three-dimensional pathway shape, according to embodiments of the disclosure.
Figure 12:
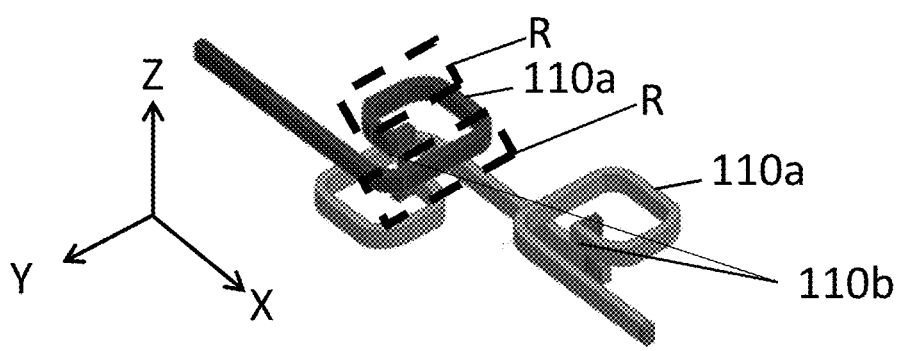
FIG. 12 shows a perspective view of a three-dimensional pathway shape, according to embodiments of the disclosure.

FIGS. 10-12 depict the three-dimensional pathway of portions of waveguide 110, in an implementation such as that described herein with respect to FIG. 9. Waveguide 110 may be subdivided into, e.g., a first horizontal portion 110a, a vertical coupling portion 110b, and a second horizontal portion 110c. Vertical coupling portion 110b may optically connect first horizontal portion 110a to second horizontal portion 110c. Although first horizontal portion 110a is shown by example to be above second horizontal portion 110b, it is understood that these positions may be reversed, and/or additional horizontal or vertical portions of waveguide 110 maybe included in further implementations. Thus, each portion 110a, 110b, 110c may be a structurally continuous portion of one waveguide 110 and/or may be structurally distinct.

Nearby components such as substrate 12, active circuitry 14, some portions of barrier structure 104, optical fiber 106, etc., are omitted solely for clarity of illustration. FIG. 10 depicts a plan view of portions of passage 108 in barrier structure 104 and waveguide 110 in plane X-Y, FIG. 11 depicts a side view of waveguide 110 in plane X-Z with barrier structure 104 omitted, and FIG. 12 depicts a perspective view of waveguide 110 with barrier structure 104 omitted. In this example configuration, reversal segment(s) R may be located within distinct horizontal planes, with various portions of passage 108 and/or waveguide 110 being interconnected through perpendicularly-extending segments. In various alternative implementations, reversal segment(s) R and/or linear segments for portions of waveguide 110a, 110b, 110c may be within the X-Z plane and/or may be oriented in other directions. Despite the three-dimensional shape of passage 108 and waveguide 110 in such configurations, PIC structure 100 remains operable to prevent crack propagation and/or moisture ingress through passage 108 of barrier structure 104. The presence of portions 110a, 110b, 110c, of waveguide 110 may make it impossible or nearly impossible for moisture to pass through each orientation of waveguide 110 in passage 108.

Figure 13:
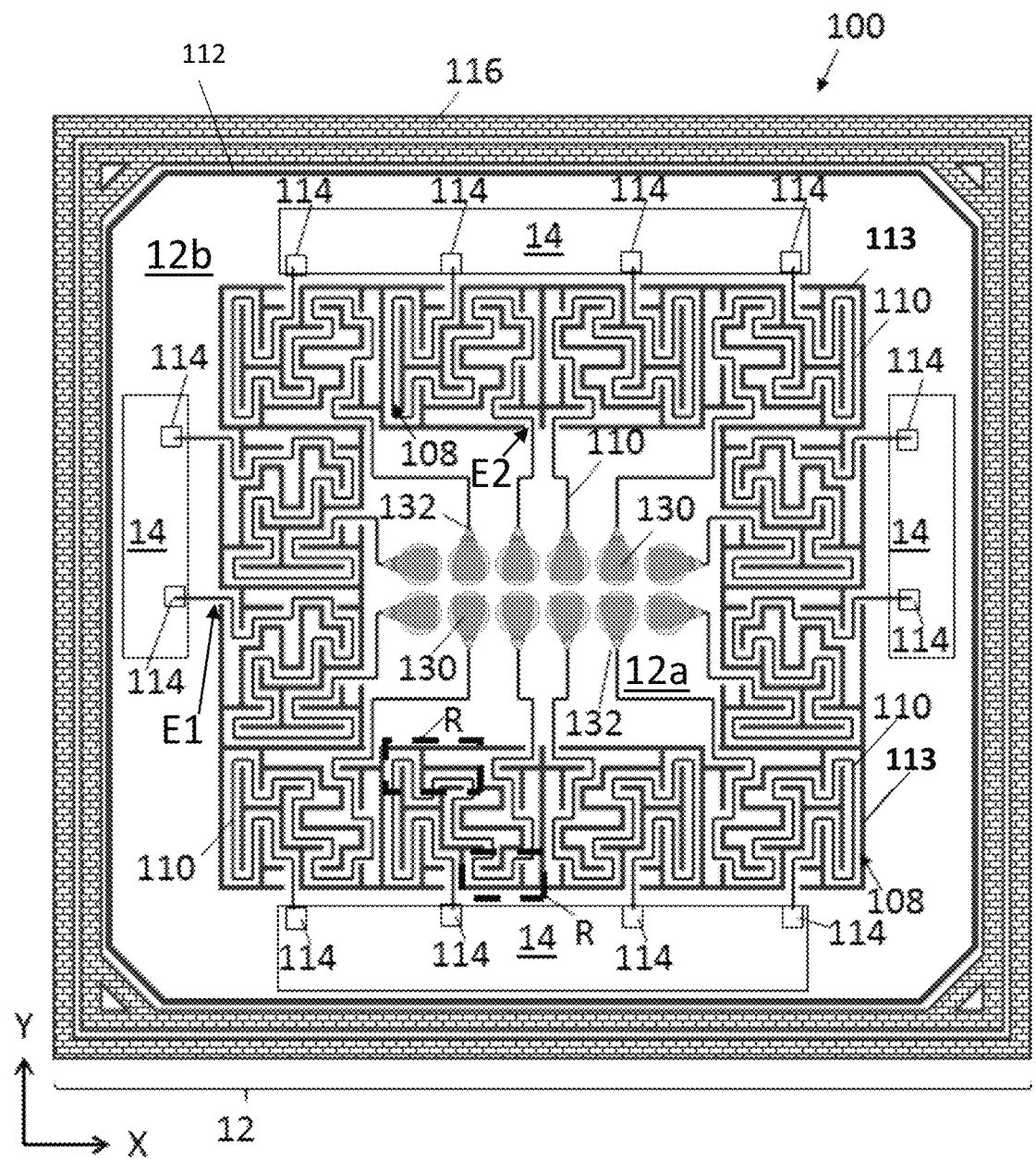
FIG. 13 shows a plan view of an oxidation and mechanical barrier with a passage for coupling a vertically oriented optical fiber to active circuitry, according to embodiments of the disclosure.

FIG. 13 provides a plan view of PIC structure 100 in a configuration for coupling to a set of vertically oriented optical fibers 130. Vertically oriented optical fibers 130 may extend in a direction that is vertically perpendicular to substrate 12, and may connect and/or optical couple to waveguide(s) 110 through respective grating couplers 132 on substrate 12. Although vertically oriented optical fibers 130 may have the same and/or similar materials as optical fibers 106 and/or may be indistinguishable from optical fibers 106 apart from their directional orientation. Here, vertically oriented optical fibers 130 may connect to substrate 12 within the horizontal interior of metal crack stop 116. Vertically oriented optical fibers 130 may extend perpendicularly with respect to substrate 12 for various purposes, e.g., for coupling to a set of metal levels in a stack positioned above substrate 12.

The presence of vertically oriented optical fibers 130 may create holes where cracks and/or moisture can attempt to propagate from second end E2 toward first end E1. To address this problem, oxidation and mechanical barrier 113 may be horizontally between active circuitry 14 and vertically oriented optical fibers 130. In this case, oxidation and mechanical barrier 113 is horizontally distal to metal crack stop 116 on substrate 12, with active circuitry 14 being located horizontally between oxidation and mechanical barrier 113 and metal crack stop 116. Here, oxidation and mechanical barrier 113 may include passages 108 for coupling waveguide(s) 110 from vertically oriented optical fibers 130 to active circuitry 14. Oxidation and mechanical barrier 113, by including passage 108 with reversal segment(s) R therein, can block moisture and/or cracks originating at the connection to vertically extending optical fibers 130 from reaching active circuitry 14.

Embodiments of the disclosure provide several technical and commercial advantages, examples of which are discussed herein. Embodiments of PIC structure 100 may be easily integrated into existing processing paradigms to form photonic IC dies, e.g., simply by changing the shape and structure of barrier structures 104 by modifying the masking materials and/or processing of oxidation and mechanical barrier 113, metal crack stop 116, etc. PIC structure 100 can be made, e.g., using traditional layer by layer fabrication processing or by using through-dielectric processing to create solid walls for barrier structure(s) 104. Through-dielectric processing, e.g., opening trenches in dielectric material and then filling with metal results in solid metal/nitride walls that do not have interfaces between layers like those seen as a result of the layer by layer processing. Embodiments of the disclosure exhibit a greater ability to impede cracks and/or moisture from physically reaching active circuitry 14 from outside PIC structure 100. Various embodiments of barrier structure(s) 104 with passage(s) 108 take up a similar amount of space as conventional structures for impeding the propagation of moisture and/or cracks into an IC chip. The shape and structure of passage(s) 108 avoids the use of segmented crack stop structures, which may accommodate waveguides but do not offer sufficient protection against cracks and moisture.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A photonic integrated circuit (PIC) structure, comprising:
    a barrier structure on a substrate, the barrier structure having a first sidewall, and a second sidewall opposite the first sidewall;
    a guard ring alongside an interior sidewall of the barrier structure, the guard ring physically separated from the barrier structure by a distance;
    a passage within the barrier structure, the passage extending from a first end at the first sidewall of the barrier structure to a second end at the second sidewall of the barrier structure, wherein the passage includes a reversal segment between the first end and the second end, and an orientation of the passage within the reversal segment transitions from a first direction between the first sidewall and the second sidewall to a second direction opposite the first direction; and
    a waveguide within the passage and extending from the first end to the second end thereof.

2. The PIC structure of claim 1, wherein:
    the passage includes a plurality of passages within the barrier structure, each of the plurality of passages extending from a respective first end at the first sidewall of the barrier structure to a respective second end at the second sidewall of the barrier structure, each of the plurality of passages including a respective reversal segment between the respective first end and the respective second end thereof; and
    the waveguide includes a waveguide in each of the plurality of passages.

3. The PIC structure of claim 1, wherein the barrier structure includes a metal crack stop structure.

4. The PIC structure of claim 1, wherein the passage includes at least one segment extending approximately 90 degrees from a horizontal plane of the substrate.

5. The PIC structure of claim 1, wherein the passage includes at least one pair of branching segments between the first end and the second end thereof.

6. A photonic integrated circuit (PIC) structure, comprising:
    a crack stop structure on a substrate, the crack stop structure having an interior sidewall, and an exterior sidewall facing toward a perimeter sidewall of the substrate;
    a passage within the crack stop structure, the passage extending from a first end at the exterior sidewall of the crack stop structure to a second end at the interior sidewall of the crack stop structure, wherein the passage includes a reversal segment between the first end and the second end, and an orientation of the passage within the reversal segment transitions from a first direction between the first end at the exterior sidewall of the crack stop structure and the second end at the interior sidewall of the crack stop structure to a second direction opposite the first direction;
    a waveguide within the passage and extending from the first end to the second end thereof; and
    a guard ring on the substrate and abutting the interior sidewall of the crack stop structure, wherein the waveguide includes at least one bridge segment positioned over the guard ring.

7. The PIC structure of claim 6, wherein:
    the passage includes a plurality of passages within the crack stop structure, each of the plurality of passages extending from a respective first end at the exterior sidewall of the crack stop structure to a respective second end at the interior sidewall of the crack stop structure, each of the plurality of passages including a respective reversal segment between the respective first end and the respective second end; and
    the waveguide includes a waveguide in each of the plurality of passages.

8. The PIC structure of claim 7, wherein each waveguide is coupled between circuitry on the substrate and a single optical fiber.

9. The PIC structure of claim 6, wherein the passage includes at least one segment extending approximately 90 degrees from a horizontal plane of the substrate.

10. The PIC structure of claim 6, wherein the passage includes at least one pair of branching segments between the first end and the second end thereof.

11. The PIC structure of claim 6, wherein the passage has a lateral width of approximately eight micrometers (μm), and extends across a distance of at least approximately 150 micrometers μm from the first end to the second end.

12. A photonic integrated circuit (PIC) structure, comprising:
    a set of grating couplers on a substrate;
    an oxidation and mechanical barrier on the substrate, the oxidation and mechanical barrier having a first sidewall facing toward the set of grating couplers, and a second sidewall opposite the first sidewall;

a passage within the oxidation and mechanical barrier, the passage extending from a first end at the first sidewall of the oxidation and mechanical barrier to a second end at the second sidewall of the oxidation and mechanical barrier without intersecting itself, wherein the passage includes a reversal segment between the first end and the second end, and an orientation of the passage within the reversal segment transitions from a first direction between the first sidewall and the second sidewall to a second direction opposite the first direction; and a waveguide including a semiconductor material and within the passage extending from the first end to the second end thereof, wherein the waveguide couples the set of grating couplers to circuitry on the substrate.

13. The PIC structure of claim 12, wherein:

the passage includes a plurality of passages within the oxidation and mechanical barrier, each of the plurality of passages extending from a respective first end at the first sidewall of the oxidation and mechanical barrier to a respective second end at the second sidewall of the oxidation and mechanical barrier, each of the plurality of passages including a respective reversal segment between the respective first end and the respective second end; and the waveguide includes a waveguide within each of the plurality of passages.

14. The PIC structure of claim 13, wherein each waveguide within the plurality of passages is coupled between the circuitry and a single optical fiber, and the single optical fiber is vertically coupled to the set of grating couplers.

15. The PIC structure of claim 12, further comprising a crack stop structure on the substrate, wherein the crack stop structure is horizontally between the circuitry and a perimeter sidewall of the substrate.

16. The PIC structure of claim 12, wherein the passage includes at least one segment extending approximately 90 degrees from a horizontal plane of the substrate.

17. The PIC structure of claim 12, wherein the passage has a lateral width of approximately eight micrometers (μm), and extends across a distance of at least approximately 150 μm from the first end to the second end.

18. The PIC structure of claim 12, wherein the oxidation and mechanical barrier includes a nitride film.

19. The PIC structure of claim 12, further comprising a guard ring alongside an interior sidewall of the oxidation and mechanical barrier, the guard ring physically separated from the oxidation and mechanical barrier by a distance.

20. The PIC structure of claim 19, wherein the waveguide includes a bridge segment positioned over the guard ring.

* * * * *